(12) United States Patent
Sen et al.

(10) Patent No.: US 10,210,725 B1
(45) Date of Patent: *Feb. 19, 2019

(54) HAPTIC ACTUATOR INCLUDING FLEXURE WITH REDUCED MATERIAL MEDIAL PORTION PROXIMAL AND DISTAL SEGMENTS AND RELATED METHODS

(71) Applicant: Apple Inc., Cupertino, CA (US)

(72) Inventors: Yi-Heng Sen, San Jose, CA (US); Jere Harrison, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,966

(22) Filed: Dec. 1, 2017

(51) Int. Cl.
| | |
|---|---|
| *G08B 6/00* | (2006.01) |
| *H05K 5/00* | (2006.01) |
| *H02K 33/18* | (2006.01) |
| *H02K 15/00* | (2006.01) |
| *H02K 5/04* | (2006.01) |

(52) U.S. Cl.
CPC .............. *G08B 6/00* (2013.01); *H02K 5/04* (2013.01); *H02K 15/00* (2013.01); *H02K 33/18* (2013.01); *H05K 5/0086* (2013.01)

(58) Field of Classification Search
CPC .......... G08B 6/00; G06F 1/163; G06F 3/016; H01H 2215/00; H01H 2231/028; H02K 33/00; H02K 33/18; H02K 5/04; H02K 15/00; H05K 5/0086
See application file for complete search history.

(56) References Cited

U.S. PATENT DOCUMENTS

| 8,169,402 B2 | 5/2012 | Shahoian et al. |
| 2014/0197936 A1 | 7/2014 | Biggs et al. |
| 2015/0109223 A1 | 4/2015 | Kessler et al. |
| 2015/0116205 A1 | 4/2015 | Westerman et al. |
| 2015/0130730 A1 | 5/2015 | Harley et al. |

FOREIGN PATENT DOCUMENTS

| WO | 2013169299 A1 | 11/2013 |
| WO | 2013169303 A1 | 11/2013 |
| WO | 2013169305 A1 | 11/2013 |
| WO | 2013170099 A1 | 11/2013 |
| WO | 2013188307 A2 | 12/2013 |
| WO | 2014018111 A1 | 1/2014 |
| WO | 2015020663 A1 | 2/2015 |

OTHER PUBLICATIONS

Product Specification Sheet: GEEPLUS, VIBRO1 Vibration Actuator, 2 pages, www.geeplus.biz, downloaded on Jul. 15, 2015.

*Primary Examiner* — Orlando Bousono
(74) *Attorney, Agent, or Firm* — Allen, Dyer, Doppelt + Gilchrist, P.A. Attorneys at Law

(57) ABSTRACT

A haptic actuator may include a housing, at least one coil carried by the housing, and a field member having opposing first and second sides. The haptic actuator may also include a respective at least one flexure mounting each of the first and second sides of the field member to be reciprocally movable within the housing responsive to the at least one coil. Each flexure may include two diverging arms joined together at proximal ends and having spaced distal ends operatively coupled between adjacent portions or the field member and the housing. The two diverging arms may each include a proximal segment having a reduced material medial portion relative to adjacent end portions, and a distal segment, being canted with respect to the proximal segment, and having a reduced material medial portion relative to adjacent end portions.

25 Claims, 8 Drawing Sheets

HAPTIC ACTUATOR INCLUDING FLEXURE WITH REDUCED MATERIAL MEDIAL PORTION PROXIMAL AND DISTAL SEGMENTS AND RELATED METHODS

TECHNICAL FIELD

The present disclosure relates to the field of electronics, and, more particularly, to the field of haptics

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

A haptic actuator may include a housing, at least one coil carried by the housing, and a field member having opposing first and second sides. The haptic actuator may also include a respective at least one flexure mounting each of the first and second sides of the field member to be reciprocally movable within the housing responsive to the at least one coil. Each flexure may include two diverging arms joined together at proximal ends and having spaced distal ends operatively coupled between adjacent portions of the field member and the housing. The two diverging arms may each include a proximal segment having a reduced material medial portion relative to adjacent end portions, and a distal segment, being canted with respect to the proximal segment, and having a reduced material medial portion relative to adjacent end portions.

The proximal segments may be parallel. The distal segments may be diverging, for example.

The proximal segments may each have an arcuate recess to define the reduced material medial portion. The distal segments may each have an arcuate recess to define the reduced material medial portion, for example.

The proximal segments may each have an opening therein to define the reduced material medial portion. The distal segments may each have an opening therein to define the reduced material medial portion, for example.

A bend defining the cant between the proximal and distal segments of each diverging arm may be positioned between 30% and 70% of a length of the diverging arm, for example. The proximal segments may each have a straight line shape, and the distal segments may each have a straight line shape, for example. Each diverging arm may have a constant thickness, for example.

A method aspect is directed to a method of making a haptic actuator. The method may include positioning a respective at least one flexure to mount each of the first and second sides of a field member to be reciprocally movable within a housing responsive to at least one coil. Each flexure may include two diverging arms joined together at proximal ends and having spaced distal ends operatively coupled between adjacent portions of the field member and the housing. The two diverging arms may each include a proximal segment having a reduced material medial portion relative to adjacent end portions, and a distal segment, being canted with respect to the proximal segment, and having a reduced material medial portion relative to adjacent end portions.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth. herein. Rather, these embodiments are provided so that this disclosure will be thorough and complete, and will fully convey the scope of the invention to those skilled in the art. Like numbers refer to like elements throughout, and prime notation is used to refer to like elements in different embodiments.

Figure 1:
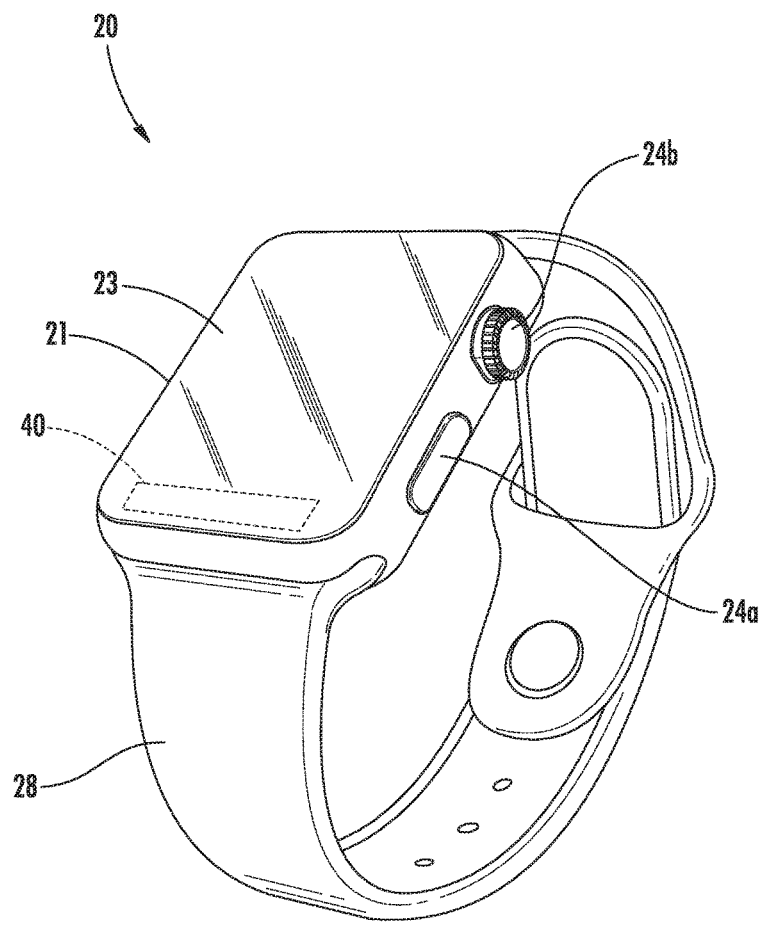
FIG. 1 is a perspective view of an electronic device including a haptic actuator according to an embodiment.
Figure 2:
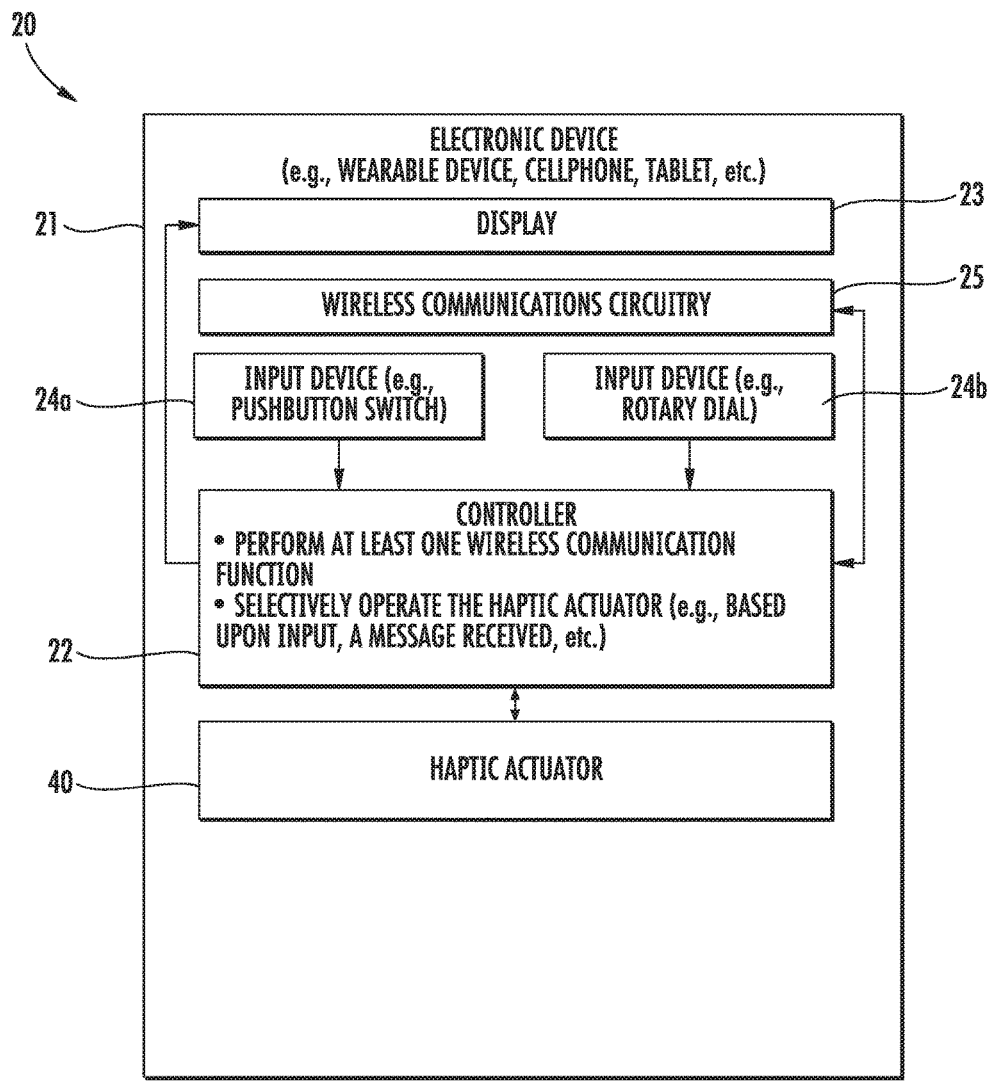
FIG. 2 is a schematic block diagram of the electronic device of FIG. 1.

Referring initially to FIGS. 1-2, an electronic device 20 illustratively includes a device housing 21 and a controller 22 carried by the device housing. The electronic device 20 is illustratively a mobile wireless communications device, for example, a wearable wireless communications device, and includes a band 28 or strap for securing it to a user. The electronic device 20 may be another type of electronic device, for example, a cellular telephone, a tablet computer, a laptop computer, etc.

Wireless communications circuitry 25 (e.g. cellular, WLAN Bluetooth, etc.) is also carried within the device housing 21 and coupled to the controller 22. The wireless communications circuitry 25 cooperates with the controller 22 to perform at least one wireless communications function, for example, for voice and/or data. In some embodiments, the electronic device 20 may not include wireless communications circuitry 25.

A display 23 is also carried by the device housing 21 and is coupled to the controller 22. The display 23 may be, for example, a liquid crystal display (LCD), light emitting diode (LED) display, or may be another type of display, as will be appreciated by those skilled in the art. The display 23 may be a touch display.

Finger-operated user input devices. 24*a*, 24*b*, illustratively in the form of a pushbutton switch and a rotary dial are also carried by the device housing 21 and are coupled to the controller 22. The pushbutton switch 24*a* and the rotary dial 24*b* cooperate with the controller 22 to perform a device function in response to operation thereof. For example, a device function may include a powering on or off of the electronic device 20, initiating communication via the wireless communications circuitry 25, and/or performing a menu function.

The electronic device 20 illustratively includes a haptic actuator 40. The haptic actuator 40 is coupled to the controller 22 and provides haptic feedback to the user in the form of relatively long and short vibrations or "taps", particularly when the user is wearing the electronic device 20. The vibrations may be indicative of a message received, and the duration of the vibration may be indicative of the type of message received. Of course, the vibrations may be indicative of or convey other types of information. More particularly, the controller 22 applies a voltage to move a moveable body or masses between first and second positions in a y-axis.

While a controller 22 is described, it should be understood that the controller 22 may include one or more of a processor and other circuitry to perform the functions described herein. For example, the controller 22 may include a class-D amplifier to drive the haptic actuator 40 and/or sensors for sensing voltage and current.

Figure 3:
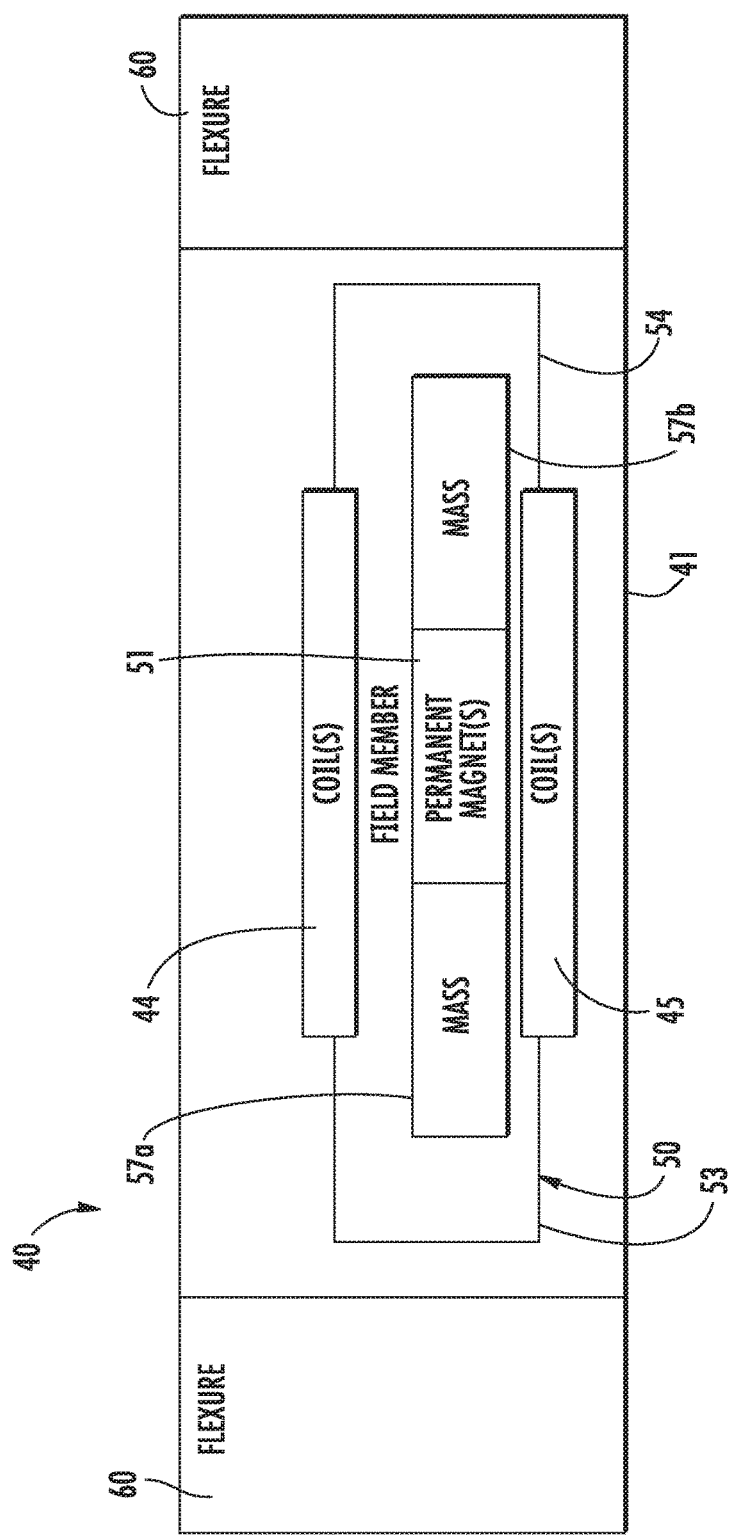
FIG. 3 is a schematic block diagram of the haptic actuator of the electronic device of FIG. 1.
Figure 4:
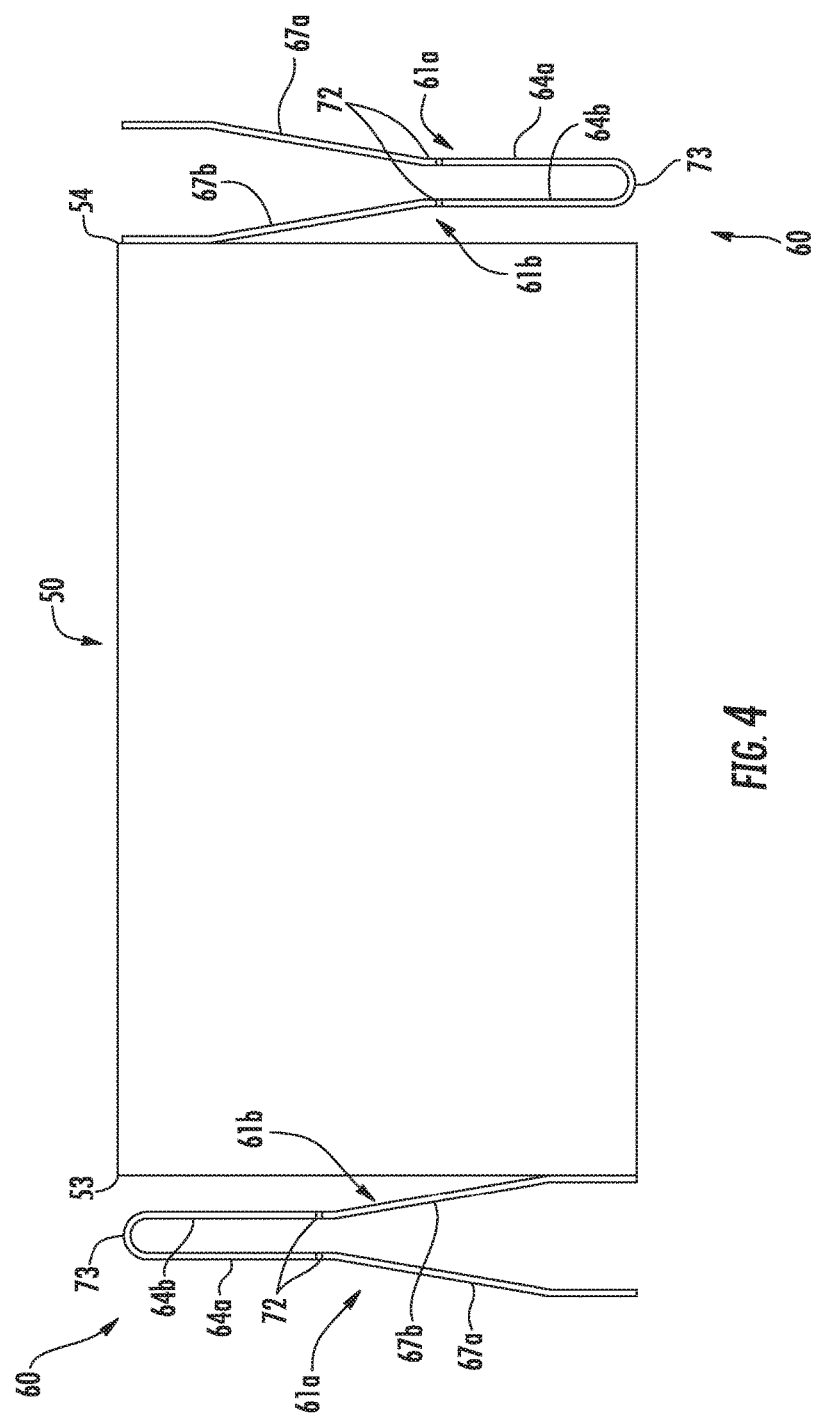
FIG. 4 is a schematic top view of a field member and respective flexures in accordance with an embodiment.
Figure 5:
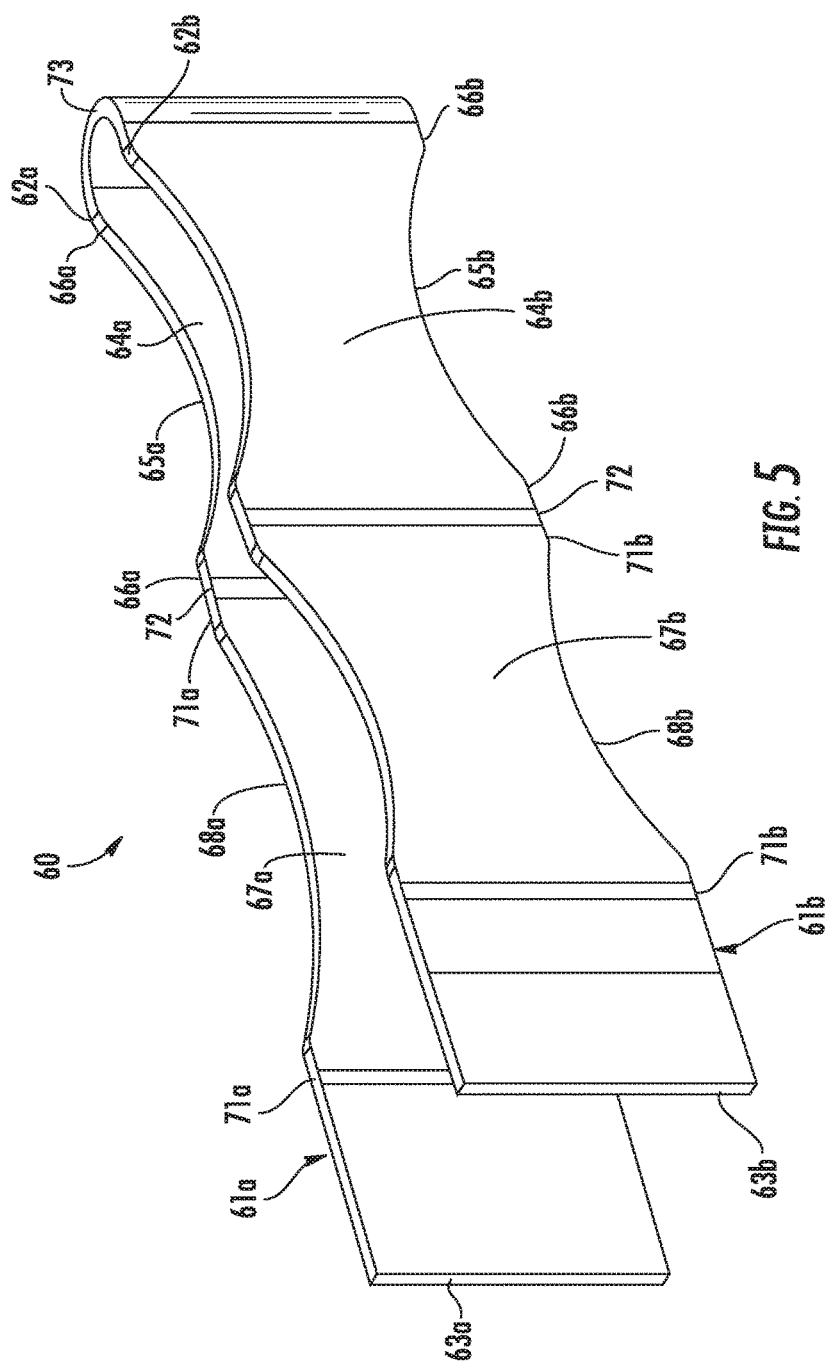
FIG. 5 a perspective view of a flexure of FIG. 4.

Referring now additionally to FIGS. 3-5 the haptic actuator 40 includes an actuator housing 41. The actuator housing 41 illustratively has a dimension in a length direction greater than a width direction.

The haptic actuator 40 also includes first and second coils 44, 45 carried by the actuator housing 41, for example, the top and the bottom, respectively. The first and second coils 44, 45 may each have a loop shape or "racetrack" shape and are aligned in a stacked relation and spaced apart. There may be any number of first and second coils 44, 45 as will be appreciated by those skilled in the art.

The haptic actuator 40 also includes a field member 50 carried by the actuator housing 41. The field member 50, similarly to the actuator housing 41, has a dimension in a length direction greater than a width direction. Thus, the field member 50 is reciprocally movable in the width direction i.e., the y-direction). While the movement of the field member 50 is described as being moveable in one direction, i.e., a linear haptic actuator, it should be understood that in some embodiments, the field member may be movable in other directions, i.e., an angular haptic actuator, or may be a combination of both a linear and an angular haptic actuator.

The field member 50 includes permanent magnets 51 between the first and second coils 44, 45. The permanent magnets 51 may be neodymium, for example, and may be positioned in opposing directions with respect to their respective poles.

The permanent magnets 51 may also have a rounded rectangle shape and may be aligned along a length of the first and second coils 44, 45. There may be any number of permanent magnets 51 having any shape between the first and second coils 44, 45.

The field member 50 also includes masses 57a, 57b adjacent the permanent magnets 51. The masses 57a, 57b may be tungsten, for example. The masses 57a, 57b may be a different material (e.g., relatively heavy material) and there may be any number of masses. In some embodiments, the field member 50 or a portion thereof may be tungsten (or other heavy material) defining the masses (e.g., instead of discrete masses).

The haptic actuator 40 also includes respective flexures 60 mounting each of first and second sides 53, 54 of the field member 50 to be reciprocally movable within the actuator housing 41 responsive to the first and second coils 44, 45.

Each flexure 60 illustratively includes two diverging arms 61a, 61b each having a constant thickness and joined together at a bend 73 at proximal ends 62a, 62b. The two diverging arms 61a, 61b also have spaced distal ends 63a, 63b operatively coupled between adjacent portions of the field member 50 and the actuator housing 41. The two diverging arms 61a, 61b may include steel, titanium, and/or copper. The two diverging arms 61a, 61b may include other and/or additional materials.

Each of the two diverging arms 61a, 61b include a proximal segment 64a, 64b having a straight line shape. In some embodiments, the proximal segments 64a, 64b may have a curved or other shape. Each proximal segment 64a, 64b has a reduced material medial portion 65a, 65b relative to adjacent end portions 66a, 66b. The reduced material medial portion 65a, 65b of each proximal segment 64a, 64b is in the form of or defined by an arcuate recess so that the height profile along the length of each proximal segment varies.

The proximal segments 64a, 64b of a given flexure 60 are illustratively parallel. In some embodiments, the proximal segments 64a, 64b may not be parallel, for example, diverging or converging.

Each diverging arm 61a, 61b also includes a distal segment 67a, 67b that is canted with respect to the proximal segment 64a, 64b and that also have a straight-line shape. In some embodiments, the distal segments 67a, 67b may have a curved or other shape. The cant 72 or bend defining the cant between the proximal and distal segments 64a, 64b, 67a, 67b of each diverging arm 61a, 61b is positioned between 30% and 70% of a length of the diverging arm.

Each distal segment 67a, 61b also has a reduced material medial portion 68a, 68b relative to adjacent end portions 71a, 71b. Similar to the proximal segments 64a, 64b, the reduced material medial portion 68a, 68b of each distal segment 67a, 61b is in the form of or defined by an arcuate recess so that the height profile along the length of each distal segment varies.

The distal segments 67a, 61b of a given flexure 60 are illustratively diverging. In some embodiments, the proximal segments 64a, 64b may not be diverging, for example, converging or parallel.

As will be appreciated by those skilled in the art, the haptic actuator 40, and more particularly, the geometry of each flexure 60 may satisfy desired stress and stiffness metrics relative to other flexure geometries, particularly under a relatively confined space under a specified amplitude of travel displacement for haptic applications. As will be described in further detail below, the flexure 60 may reduce stresses relative to other shaped flexures, for example, U-shaped flexures, and while maintaining the equivalent spring constant in the travel direction. Additionally, the flexure 60 may further increase the spring constants in other directions, which may reduce unwanted oscillation from the main desired direction of travel. Thus, the life and reliability of the haptic actuator 40 may be increased with relatively little sacrifice of stiffness and with a relatively small increase in manufacturing cost.

To achieve desired operating characteristics, from a design perspective, each flexure 60 is formed so that the flexure (a) has an appropriate stiffness in travel direction (e.g., here denoted as X-direction) for an intended resonant frequency, (b) fits within an allocated space and exhibits a relatively low stress throughout the entire flexure across the full travel displacement to avoid fatigue fractures, and (c) so that stiffness in two remaining directions orthogonal to the travel directions can be tuned more freely. Other shaped flexures may not optimize the above-noted objectives. As a result, the other shaped flexures may show signs of early fatigues due to high stress and unwanted oscillation in non-travel directions (e.g., Y- and Z -directions).

Figure 6:
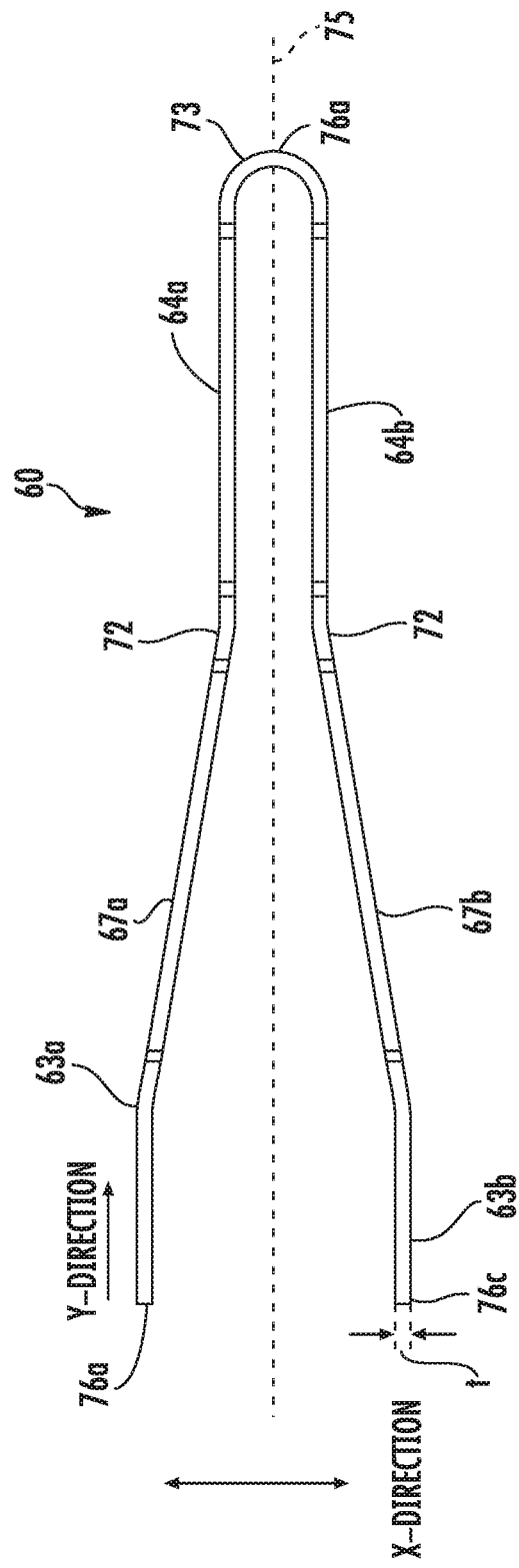
FIG. 6 is a top view of a flexure in accordance with an embodiment.
Figure 7:
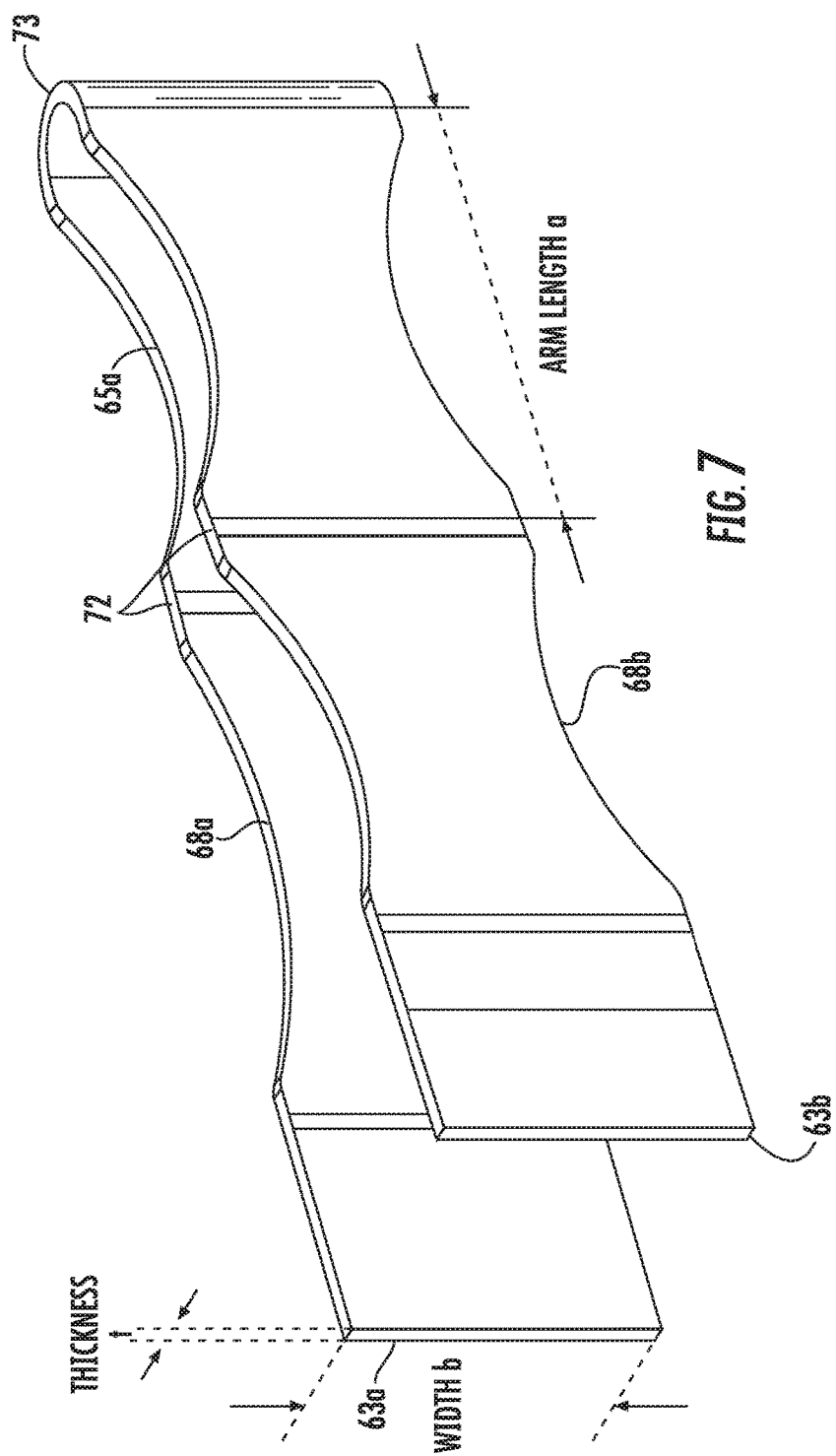
FIG. 7 is a perspective view of the flexure of FIG. 6.

Referring now additionally to FIGS. 6-7, an analytical model of the flexure 60 is now described. The flexure 60 is symmetric about the line 75, and its travel direction is along its thickness direction. The top half of the flexure 60 may be (approximately) modeled as two fixed-free cantilever beams with the fixed ends (i.e., pivot/roots 76a-76c) at the ends and the joint free end in the middle. The stress (equation 1, below) at any cross-section depends on the moment M (equation 2, below), thickness t and the second moment of inertia I (equation 3, below). Assuming M=moment, t=thickness of the flexure, b=width of the flexure, dL=arm, dX=travel distance, k=equivalent stiffness/spring constant:

$$\sigma = \frac{M \times t}{2I} \quad (1)$$

$$M = k \times \Delta x \times \Delta l \quad (2)$$

$$I = \frac{b \times t^3}{12} \quad (3)$$

From the equations above, those skilled in the art will appreciate that: (1) With the same spring constant k and given travel distance, the moment M at any cross-section of interest depends on the distance between its location to the root/pivot; and (2) If the moment M scales linearly with the second moment of inertia at any cross section, the strain and therefore the stress is distributed generally uniformly. Therefore, the maximum stress across the entire flexure 60 may be reduced. In other words, the reduced material medial portions 65a, 65b, 68a, 68b distribute the strain uniformly by changing the second moment of inertia at each cross section, and therefore the maximum stress across the flexure is reduced.

To further highlight potential advantages of the flexure 60, a simulated comparison between a U-shaped flexure and the flexure as described herein is made in Table 1 below.

TABLE 1

| Flexure Dimension, Stiffness, and Stress | U-shaped flexure | Flexure of the embodiments |
|---|---|---|
| X (mm) | 2.21 | 2.21 |
| Y (mm) | 9.71 | 9.71 |
| Z (mm) | 2.2 | 2.2 |
| Distance Traveled (mm) | 0.65 | 0.65 |
| Maximum Stress (MPa) | 393 | 350 (11% lower) |
| Stiffness_X (N/m) (travel direction) | 863 | 866 |
| Stiffness_Y (N/m) | 10,421 | 13,322 |
| Stiffness_Z (N/m) | 42,874 | 28,286 |

Illustratively, the maximum stress of the flexure 60 is about 11% lower than that of the U-shape flexure, while the travel distance and stiffness in travel direction is maintained. Additionally, the stiffness in Y-direction is increased, while the stiffness in the Z-direction is decreased. For a flexure, the higher the stiffness in directions other than the main travel direction, the further away other resonant modes are from the main resonance (X), and therefore there may be less unwanted vibration excited in those modes from normal travel. Since the Y-mode is closer to X, the improvement in Y for the flexure 60 becomes more advantageous.

Accordingly, several characteristics of the flexure 60 in terms of dimensions affect or reduce stress and fatigue while achieving desired stiffness (e.g., in the X-, Y-, and Z-directions). More particularly, such dimensions may include flexure thickness t, radius of the bend 73, arm length a, and size of the reduced material medial portions 65a, 65b, 68a, 68b (e.g., arcuate recess and/or opening). Thus, it may be desirable to increase the stiffness in the Y- and Z -directions as high as possible, while decreasing the stress to as low as possible, for example, in both the bend 73 and distal ends 63a, 63b of the diverging arms 61a, 61b.

Figure 8:
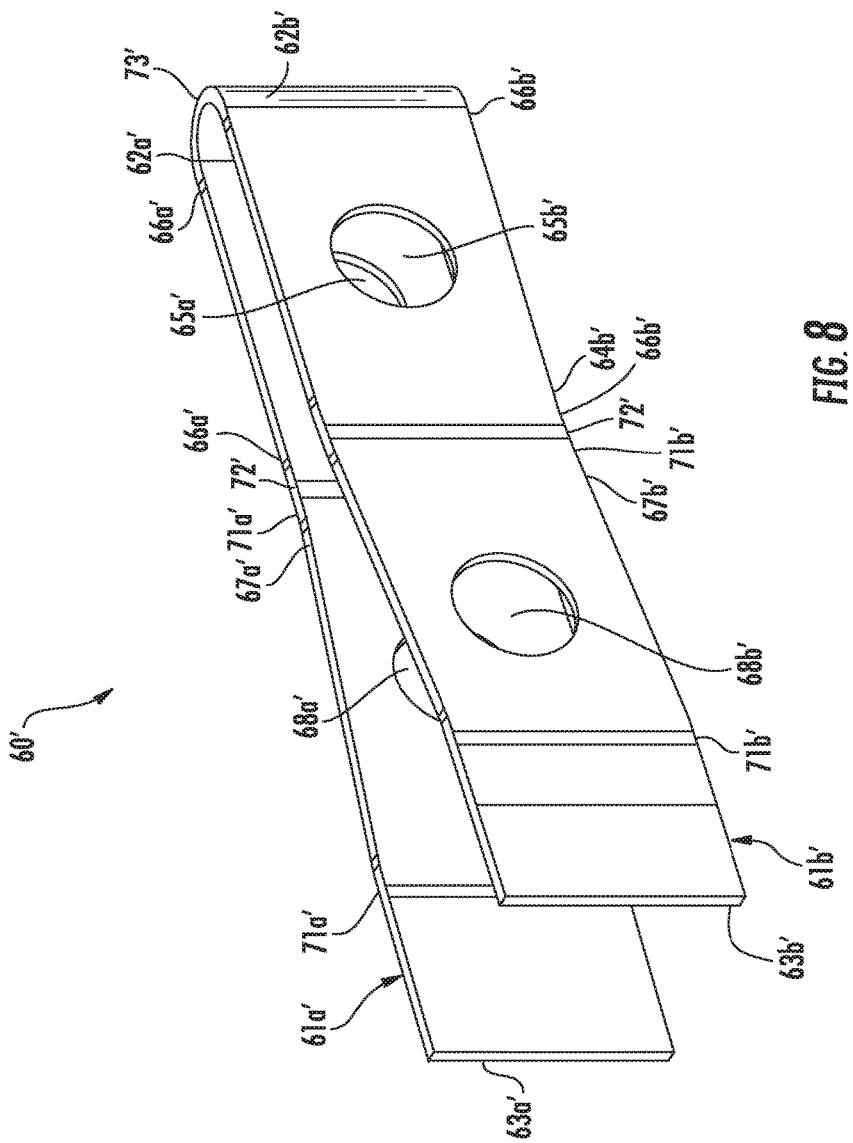
FIG. 8 is a perspective view of a flexure in accordance with another embodiment.

Referring now briefly to FIG. 8, in another embodiment, the reduced material medial portion 65a', 65b', 68a', 68b' may be in the form of or defined by an opening, for example, a circular opening, therein in each diverging arm 61a', 61b'. More particularly, the proximal segments 64', 64b' may each have an opening therein to define the respective reduced material medial portion 65a', 65b', and the distal segments 67a', 67b' also each have an opening therein to define the respective reduced material medial portion 68a', 68b'. The opening may be in the form of another shape and each opening may be a different shape.

As will be appreciated by those skilled in the art, in some embodiments, the haptic actuator 40 may include more than one flexure 60 mounting each of first and second sides 53, 54 of the field member 50 to be reciprocally movable within the actuator housing 41 responsive to the first and second coils 44, 45. For example, there may be two flexures 60 in opposing relation mounting each of the first and second sides 53, 54 of the field member 50 to he reciprocally movable within the actuator housing 41 responsive to the first and second coils 44, 45. Moreover, while the reduced material medial portions 65a, 65b, 68a, 68b are described as being in the form of either an arcuate recess or an opening, the reduced material medial portions may take on another form. The reduced material medial portions of each diverging arm 61a, 61b may be defined differently, for example, in one arm the reduced material medial portions may be in the form of arcuate recesses, while in the other diverging arm, the reduced material medial portions may be in the form of an opening. The reduced material medial portions 65a, 65b, 68a, 68b may also be different within the same diverging arm 61a, 61b. In other words, the reduced material medial portion of the proximal segment may be defined differently or take on a different form of the reduced material medial portion of the distal segment. Even still further, while two (proximal and distal) segments have been described, there may be more than two segments per diverging arm 61a, 61b.

A method aspect is directed to a method of making a haptic actuator 40. The method includes positioning a respective at least one flexure 60 to mount each of the first and second sides. 53, 54 of a field member 50 to be reciprocally movable within an actuator housing 41 responsive to at least one coil 44, 45. Each flexure 60 includes two diverging arms 61a, 61b joined together at proximal ends 62a, 62b and having spaced distal ends 63a, 63b operatively coupled between adjacent portions of the field member 50 and the actuator housing 41. The two diverging arms 61a, 61b each include a proximal segment 64a, 64b having a reduced material medial portion 65a, 65b relative to adjacent end portions 66a, 66b, and a distal segment 67a, 67b that is canted with respect to the proximal segment and has a reduced material medial portion 68a, 68b, relative to adjacent end portions 71a, 71b.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A haptic actuator comprising:
a housing;
at least one coil carried by the housing;
a field member having opposing first, and second sides; and
a respective at least one flexure mounting each of the first and second sides of the field member to be reciprocally movable within the housing responsive to the at least one coil;
each flexure comprising two diverging arms joined together at proximal ends and having spaced distal ends operatively coupled between adjacent portions of the field member and the housing, the two diverging arms each comprising
a proximal segment having a reduced material medial portion relative to adjacent end portions, and
a distal segment, being canted with respect to the proximal segment, and having a reduced material medial portion relative to adjacent end portions.

2. The haptic actuator of claim 1 wherein the proximal segments are parallel.

3. The haptic actuator of claim 1 wherein the distal segments are diverging.

4. The haptic actuator of claim 1 wherein the proximal segments each have an arcuate recess to define the reduced material medial portion.

5. The haptic actuator of claim 1 wherein the distal segment each have an arcuate recess to define the reduced material medial portion.

6. The haptic actuator of claim 1 wherein the proximal segments each have an opening therein to define the reduced material medial portion.

7. The haptic actuator of claim 1 wherein the distal segments each have an opening therein to define the reduced material medial portion.

8. The haptic actuator of claim 1 wherein a bend defining the cant between the proximal and distal segments of each diverging arm is positioned between 30% and 70% of a length of the diverging arm.

9. The haptic actuator of claim 1 wherein the proximal segments each have a straight line shape.

10. haptic actuator of claim 1 wherein the distal segments each have a straight line shape.

11. The haptic actuator of claim 1 wherein each diverging arm has a constant thickness.

12. The haptic actuator of claim 1 wherein at least one of the proximal and distal segments each has an opening therein to define the reduced material medial portion.

13. The haptic actuator of claim 1 wherein a bend defining the cant between the proximal and distal segments of each diverging arm is positioned between 30% and 70% of a length of the diverging arm.

14. An electronic device comprising:
a housing;
wireless communications circuitry carried by the housing;
a haptic actuator carried by the housing and comprising
an actuator housing;
at least one coil carried by the housing;
a field member having opposing first and second sides, and
a respective at least one flexure mounting each of the first and second sides of the field member to be reciprocally movable within the housing responsive to the at least one coil,
each flexure comprising two diverging arms joined together at proximal ends and having spaced distal ends operatively coupled between adjacent portions of the field member and the housing, the two diverging arms each comprising
a proximal segment having a reduced material medial portion relative to adjacent end portions, and
a distal segment, being canted with respect to the proximal segment, and having a reduced material medial portion relative to adjacent end portions; and
a controller coupled to the wireless communications circuitry and the haptic actuator and configured to perform at least one-wireless communications function and selectively operate the haptic actuator.

15. The electronic device of claim 14 wherein the proximal segments are parallel.

16. The electronic device of claim 14 wherein the distal segments are diverging.

17. The electronic device of claim 14, wherein the proximal segments each have an arcuate recess to define the reduced material medial portion.

18. The electronic device of claim 14 wherein at least one of the proximal and distal segments each has an arcuate recess to define the reduced material medial portion.

19. The electronic device of claim 14 wherein at least one of the proximal and distal segments each has an opening therein to define the reduced material medial portion.

20. The electronic device of claim 14 wherein a bend defining the cant between the proximal and distal segments of each diverging arm is positioned between 30% and 70% of a length of the diverging arm.

21. A method of making a haptic actuator comprising: positioning a respective at least one flexure to mount each of opposing first and second sides of a field member to be reciprocally movable within a housing responsive to at least one coil, each flexure comprising two diverging arms joined together at proximal ends and having spaced distal ends operatively coupled between adjacent portions of the field member and the housing, the two diverging arms each comprising a proximal segment having a reduced material medial portion relative to adjacent end portions, and a distal segment, being canted with respect to the proximal segment, and having a reduced material medial portion relative to adjacent end portions.

22. The method of claim 21 wherein the proximal segments are parallel.

23. The method of claim 21 wherein the distal segments are diverging.

24. The method of claim 21 wherein the proximal segments each have an arcuate recess to define the reduced material medial portion.

25. The method of claim 21 wherein at least one of the proximal and distal segments each has an arcuate recess to define the reduced material medial portion.

* * * * *

UNITED STATES PATENT AND TRADEMARK OFFICE
CERTIFICATE OF CORRECTION

PATENT NO. : 10,210,725 B1
APPLICATION NO. : 15/828966
DATED : February 19, 2019
INVENTOR(S) : Sen et al.

Page 1 of 1

It is certified that error appears in the above-identified patent and that said Letters Patent is hereby corrected as shown below:

On the Title Page

Item (57)    Delete: "or"
             Insert: --of--

In the Claims

Column 7, Line 37    Delete: "segment"
                     Insert: --segments--

Column 7, Line 51    Delete: "haptic"
                     Insert: --The haptic--

Column 8, Line 29    Delete: "14, wherein"
                     Insert: --14 wherein--

Signed and Sealed this
Thirtieth Day of April, 2019

Andrei Iancu
*Director of the United States Patent and Trademark Office*